(12) United States Patent
Pichler

(10) Patent No.: US 6,255,774 B1
(45) Date of Patent: Jul. 3, 2001

(54) MULTILAYER CATHODE FOR ORGANIC LIGHT-EMITTING DEVICE

(75) Inventor: Karl Pichler, Hopewell Junction, NY (US)

(73) Assignee: Cambridge Display Technology, Ltd., Cambridge (GB)

( * ) Notice: Subject to any disclaimer, the term of this patent is extended or adjusted under 35 U.S.C. 154(b) by 0 days.

(21) Appl. No.: 09/254,294

(22) PCT Filed: Sep. 4, 1997

(86) PCT No.: PCT/GB97/02380

§ 371 Date: Jun. 18, 1999

§ 102(e) Date: Jun. 18, 1999

(87) PCT Pub. No.: WO98/10621

PCT Pub. Date: Mar. 12, 1998

(30) Foreign Application Priority Data

| Sep. 4, 1996 | (GB) | .................................................. 9618473 |
| Sep. 4, 1996 | (GB) | .................................................. 9618474 |
| Sep. 4, 1996 | (GB) | .................................................. 9618475 |

(51) Int. Cl.$^7$ ...................................................... H01J 63/04
(52) U.S. Cl. ........................ 313/504; 313/502; 313/503; 313/506; 428/690; 257/10
(58) Field of Search ..................... 313/504, 506, 313/503, 509, 502, 505; 428/690; 257/10

(56) References Cited

U.S. PATENT DOCUMENTS

| 4,539,507 | 9/1985 | VanSlyke et al. | ...................... 313/504 |
| 5,006,915 | 4/1991 | Yoshikawa et al. | ...................... 357/61 |
| 5,047,687 | 9/1991 | VanSlyke | .............................. 313/503 |
| 5,059,861 | 10/1991 | Littman et al. | ...................... 313/503 |

(List continued on next page.)

FOREIGN PATENT DOCUMENTS

| 0278757 A2 | 8/1988 | (EP) . |
| 0443861 A2 | 8/1991 | (EP) . |
| 0468437 A2 | 1/1992 | (EP) . |
| 0468438 A2 | 1/1992 | (EP) . |
| 0468439 A2 | 1/1992 | (EP) . |

(List continued on next page.)

OTHER PUBLICATIONS

Nguyen et al., "Influence of Thermal And Plasma Treatments On The Electrical Properties Of Poly (para–phenylene vinylene)–Based Diodes," Synthetic Metals, 72, pp. 35–39, 1995.
Bulovic et al., "A Surface–Emitting Vacuum–Deposited Organic Light–Emitting Device," Applied Physics Letters, Jun. 2, 1997, vol. 70, No. 22, pp. 2954–2956, XP002051289.
Bulovic et al., "Transparent Organic Light–Emitting Devices," Applied Physics Letters, May 6, 1996, vol. 68, No. 19, pp. 2606–2608.
Suzuki et al., "Organic Light–Emitting Diodes With Radio Frequency Sputter–Deposited Electron Injecting Electrodes," Applied Physics Letters, Apr. 15, 1996, vol. 68, No. 16, pp. 2276–2278, XP000585170.
Patent Abstracts of Japan, Section E, Section No. 898, vol. 14, No. 117, p. 4, May 3, 1990 and JP 1–312874A (NEC).

*Primary Examiner*—Nimeshkumar D. Patel
*Assistant Examiner*—Joseph Williams
(74) *Attorney, Agent, or Firm*—Wolf, Greenfield & Sacks, P.C.

(57) ABSTRACT

An organic light-emitting device wherein the cathode (4, 5) comprises a first layer (5) of a conducting material and a second layer (4) of a conductive material having a work function of at most 3.7 eV and wherein the second layer is substantially thinner than the first layer, having a thickness of at most 5 nm.

11 Claims, 1 Drawing Sheet

U.S. PATENT DOCUMENTS

Figure 1:
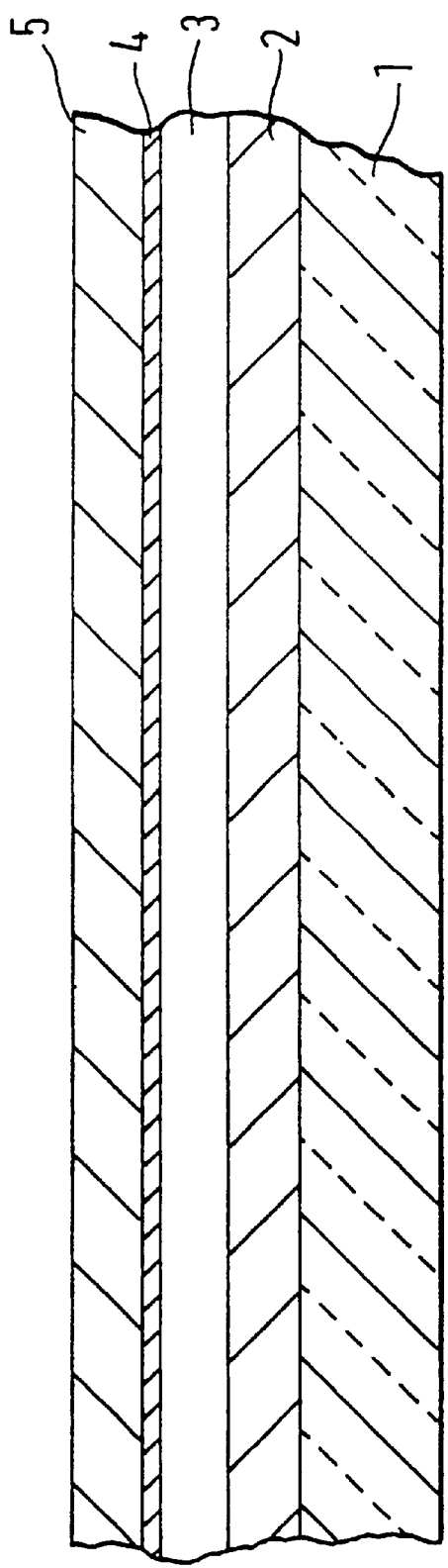

| | | | |
|---|---|---|---|
| 5,059,862 | 10/1991 | VanSlyke et al. | 313/503 |
| 5,247,190 | 9/1993 | Friend et al. | 257/40 |
| 5,399,936 | 3/1995 | Namiki et al. | 313/504 |
| 5,429,884 | 7/1995 | Namiki et al. | 428/690 |
| 5,776,622 | 7/1998 | Hung et al. | 428/690 |

FOREIGN PATENT DOCUMENTS

| | | |
|---|---|---|
| 0549345 A2 | 6/1993 | (EP) . |
| 0553950 A2 | 8/1993 | (EP) . |
| 0563009 A1 | 9/1993 | (EP) . |
| 0605739 A1 | 7/1994 | (EP) . |
| 0684753 A1 | 11/1995 | (EP) . |
| 7-85973 | 3/1995 | (JP) . |
| 7-150137 | 6/1995 | (JP) . |
| 8-264278 | 10/1996 | (JP) . |
| 9-35871 | 2/1997 | (JP) . |
| WO 94/03031 | 2/1994 | (WO) . |
| WO 95/24056 | 9/1995 | (WO) . |

MULTILAYER CATHODE FOR ORGANIC LIGHT-EMITTING DEVICE

The field of the invention relates to organic light-emitting devices with efficient electron injecting electrodes.

Organic light-emitting devices (OLEDs) such as described in earlier U.S. Pat. No. 5,247,190 assigned to Cambridge Display Technology Limited, or in Van Slyke et al., U.S. Pat. No. 4,539,507, the contents of which are herein incorporated by reference and example, have great potential for use in various display applications. Principally, an OLED consists of an anode that injects positive charge carriers, a cathode that injects negative charge carriers and at least one organic electroluminescent layer sandwiched between the two electrodes. One of the key advantages of the OLED technology is that devices can be operated at low drive voltages, provided that suitable electro-luminescent organic layers, and electrodes with good efficiencies for the injection of positive and negative charge carriers, are used. Typically although not necessarily the anode is a thin film of, for example, indium-tin-oxide (ITO), which is a semi-transparent conductive oxide which is commercially readily available already deposited on glass or plastic substrates. The organic layer(s) is normally deposited onto the ITO-coated substrate by, for example, evaporation, or any one of spin-coating, blade-coating, dip-coating or meniscus-coating. The final step of depositing the cathode layer onto the top organic layer is normally performed by thermal evaporation or sputtering of a suitable cathode metal. Layers of Al, Ca or alloys of Mg:Ag or Mg:In or Al alloys are often used as cathode materials. In order to achieve good performance in OLEDs it is of great importance to optimise all individual layers, the anode, the cathode and the organic layer(s), as well as the interfaces between the layers.

It is very often found that the electron-injection properties of the cathode are particularly important to achieve efficient device operation. Due to the electronic structure of most organic electroluminescent materials it is very often necessary to employ cathode materials with a low work function to achieve efficient electron injection and low operating voltages. Such cathodes for OLEDs are typically alkali metals such as Li, Na, K, Rb or Cs, alkaline earth metals such as Mg, Ca, Sr or Ba or lanthanides such as Sm, Eu, Tb or Yb. These materials tend to react very readily with oxygen and moisture and particular care has to be taken on handling and/or during and after deposition onto OLEDs. Often these low work function materials are deposited as cathode layers onto OLEDs in the form of alloys whereby other alloy constituents stabilise the cathode layer; typical such alloys are for example Mg:Al, Mg:In or Mg:Ag or Al:Li. When using some of these low work function elements, for instance Ca, K, Li or Sm in pure or alloy form as OLED cathode layers these elements can diffuse into the organic layer(s) and subsequently dope the organic layer(s), cause electrical shorts or quench photo-luminescence, and therefore generally deteriorate device performance.

It is thus an object of the present invention to provide a structure, and method of fabrication for, an organic light-emitting device that incorporates low work function elements as cathodes to achieve efficient injection of negative charge carriers and low operating voltage, but minimises at least some of the problems outlined above.

According to a first aspect of the present invention there is provided an organic light-emitting device, comprising at least one layer of a light-emissive organic material arranged between an anode and a cathode for the device, wherein the cathode comprises a first layer of a conductive material which is an opaque metallic layer of high conductivity and a second layer of a conductive material having a low work function arranged between the at least one layer of organic material and the first layer of conductive material, wherein the second layer of conductive material is substantially thinner than the first layer of conductive material, having a thickness of at most 5 nm, and comprises an elemental metal, an alloy or an intermetallic compound having a work function of at most 3.7 eV.

Thus, the cathode is composed of a thin layer of an elemental metal, alloy or inter-metallic compound, with a work function of at most 3.7 eV, but preferably less than 3.2 eV. The cathode layer has a thickness of at most 5 nm, but preferably of between 0.5 and 2 nm thick. The thin, low work function cathode layer is preferably capped with another conductive layer, typically 100–500 nm thick, which provides high conductivity protection for the underlying thin, low work function layer, as well as environmental stability. Such a bi-layer electrode structure according to the first aspect of the present invention forms a cathode layer with efficient electron injection for an OLED with at least one electro-luminescent organic layer between said cathode layer and an anode layer, the anode layer for injecting positive charge carriers.

Such a structure prevents excessive doping and mini-mises the risk of shorting of the device structure and quenching of the electro-luminescence of the at least one layer of organic material. The first aspect of the invention also provides a method of fabricating an organic light-emitting device, comprising the steps of forming a cathode for the device over a substrate, which step comprises forming a first layer of a conductive material of high conductivity over a substrate and forming a second layer of a conductive material having a low work function over the first layer of conductive material, wherein the first layer of conductive material is an opaque metallic layer and the second layer of conductive material is substantially thinner than the first layer of conductive material having a thickness of at most 5 nm, and comprises an elemental metal, an alloy or an intermetallic compound having a work function of at most 3.7 eV, forming at least one layer of a light-emissive organic material over the cathode and forming an anode for the device over the at least one layer of organic material.

The first aspect of the invention further provides a method of fabricating an organic light-emitting device, comprising the steps of forming an anode for the device over a substrate, forming at least one layer of a light-emissive material over the anode and forming a cathode for the device over the at least one layer of organic material, which step comprises forming a second layer of a conductive material having a low work function over the at least one layer of organic material and forming a first layer of a conductive material of high conductivity over the second layer of conductive material, wherein the first layer of conductive material is an opaque metallic layer and the second layer of conductive material is substantially thinner than the first layer of conductive material having a thickness of at most 5 nm, and comprises an elemental metal, an alloy or an intermetallic compound having a work function of at most 3.7 eV.

Thus there is also provided a method of fabrication for an OLED with an efficient electron-injecting electrode in which at least one electro-luminescent organic layer, preferably either polymeric or molecular, is deposited preferably onto a supportive substrate pre-coated with an anode. The organic layer is coated in one embodiment by vacuum evaporation, with a thin layer of conductive, low work function material.

This layer is at most 5 nm but preferably between 0.5 and 2 nm thick, and still more preferably about 0.5 nm. This thin layer is typically, but not essentially, an alkali metal, alkaline earth metal or a lanthanide or an alloy or inter-metallic compound incorporating one or more of said alkali metal, alkaline earth metal or lanthanide elements. The thin low work function layer is then preferably covered with a thick conductive layer of typically 100 to 500 nm thickness which provides high conductivity, protection for the underlying thin low work function layer and environmental stability, and which is preferably applied by vacuum evaporation or sputter deposition.

According to a second aspect of the present invention there is provided an organic light-emitting device, comprising at least one layer of a light-emissive organic material arranged between an anode and a cathode for the device, wherein the cathode comprises a first layer of a conductive material which is a DC magnetron sputtered metallic layer of high conductivity and a second layer of a conductive material having a low work function arranged between the at least one layer of organic material and the first layer of conductive material, wherein the second layer of conductive material is substantially thinner than the first layer of conductive material.

Such a structure provides advantages similar to those discussed above with reference to the first aspect of the present invention.

The invention will now be described with reference to a particular example as shown in the accompanying drawing, in which:

FIG. 1 illustrates a structure of an OLED in accordance with the present invention.

According to the illustrated embodiment of the invention, an OLED is formed by first forming a semi-transparent anode deposited onto a transparent supportive substrate. The substrate is, for example, a thin sheet of glass or plastic such as polyester, polycarbonate, polyimide, polyether-imide or the like. Referring to FIG. 1, a glass substrate 1 is covered with a layer of a semi-transparent conductive indium-tin-oxide (ITO) layer 2, typically about 150 nm thick with a sheet resistance of typically ≦30 Ohms/square. Although the semi-transparent anode shown in FIG. 1 is a thin layer of conductive oxide such as indium-tin-oxide, it may alternatively be a doped tin-oxide or zinc-oxide.

The organic layer(s) deposited on top of the anode/substrate is/are preferably, but not necessarily, one or more layers of an electro-luminescent conjugated polymer such as described in earlier U.S. Pat. No. 5,247,190 assigned to Cambridge Display Tehnology Limited. Such organic layer is formed to a thickness typically of the order of 100 nm thick. Alternatively the organic layer(s) could be low molecular weight compounds such as described in U.S. Pat. No. 4,539,507, or a combination of layer(s) of conjugated polymer(s) with layer(s) of low molecular weight compound (s). In FIG. 1, the ITO layer is covered with a ca. 100 nm thick layer 3 of the electroluminescent polymer poly(p-phenylene vinylene), PPV, as for example described in U.S. Pat. No. 5,247,190.

The cathode may be a thin layer of an alkali metal, alkaline earth metal or a lanthanide or an alloy or inter-metallic compound incorporating one or more of said alkali metal, alkaline earth metal or lanthanide elements. The cathode layer is at most 5 nm but preferably between 0.5 and 2 nm thick and examples for materials which may be used are Li, K, Sm, Ca or an Al:Li alloy. In the example of FIG. 1, the PPV layer 3 is preferably covered with a 0.5 nm thick layer 4 of Li deposited by vacuum sublimation of the Li from a commercial Al:Li alloy.

The thin layer of the cathode may be sputter deposited, preferably by DC magnetron sputtering or RF sputtering. The thin layer of the cathode may also be evaporated, preferably by resistive evaporation or electron beam thermal evaporation.

The thin layer of the cathode, being a conductive material comprising either an elemental metal, an alloy or an inter-metallic compound having a work function of at most 3.7 eV, and preferably at most 3.2 eV.

The thin layer is then preferably covered with a conductive layer of, for example, aluminium or an aluminium alloy which is typically between 100 and 500 nm thick, and preferably about 100 nm. In FIG. 1, the thin layer 4 is, without breaking vacuum, preferably covered with a 150 nm thick layer 5 of Aluminium deposited by vacuum evaporation.

The thick conductive layer may be sputtered, preferably by DC magnetron sputtering or RF sputtering. The thick layer may also be evaporated by resistive evaporation or electron-beam thermal evaporation.

Preferably, the ratio of the thickness of the thick conductive layer to the thin layer is 20:1.

The layer thicknesses are controlled by a standard quartz crystal thickness monitor in combination with a shutter.

In an alternative arrangement, the two-layer cathode described with reference to FIG. 1 is formed on the substrate, the at least one layer of a light-emissive organic material is formed over the cathode, and the anode formed over the at least one layer of light-emissive organic material.

The thin layer of Li provides excellent electron injection and low turn-on and operating voltage and, although diffusion of the Li from layer 4 into the PPV layer 3 with subsequent doping and quenching of electro-luminescence in the PPV is not prohibited, the limited thickness and hence amount of material of layer 4 prevents excessive doping and electro-luminescence quenching.

There thus has been described a device structure, and process of fabrication thereof, for an OLED with an efficient low work function electron-injecting cathode with minimised risk of excessive doping of the organic layer(s) by the low work function cathode, and therefore minimised risk of shorting of the device structure and quenching of electro-luminescence.

What is claimed is:

1. An organic light-emitting device, comprising at least one layer of a light-emissive organic material arranged between an anode and a cathode for the device, wherein the cathode comprises a first layer of a conductive material which is an opaque metallic layer of high conductivity and a second layer of a conductive material having a low work function arranged between the at least one layer of organic material and the first layer of conductive material, wherein the second layer of conductive material is substantially thinner than the first layer of conductive material, having a thickness of at most 5 nm, and comprises an elemental metal, an alloy or an intermetallic compound having a work function of at most 3.7 eV.

2. An organic light-emitting device according to claim 1, wherein the second layer of conductive material has a thickness in the range of from 0.5 to 2 nm, preferably about 0.5 nm.

3. An organic light-emitting device according to claim 1, wherein the second layer of conductive material comprises an elemental metal, an alloy or an intermetallic compound having a work function of at most 3.2 eV.

4. An organic light-emitting device according to any of claim 1, wherein the second layer of conductive material comprises one of an alkali metal, an alkaline earth metal or a lanthanide, or an alloy or an intermetallic compound thereof.

5. An organic light-emitting device according to claim 4, wherein the second layer of conductive material comprises one of Ca, K, Li, Sm or an Al—Li alloy.

6. An organic light-emitting device according to any of claim 1, wherein the ratio of thicknesses of the first layer of conductive material to the second layer of conductive material is at least 20:1.

7. An organic light-emitting device according to claim 2, wherein the second layer of conductive material comprises an elemental metal, an alloy or an intermetallic compound having a work function of at most 3.2 eV.

8. An organic light-emitting device, comprising at least one layer of a light-emissive organic material arranged between an anode and a cathode for the device, wherein the cathode comprises a first layer of a conductive material which is an opaque metallic layer of high conductivity and a second layer of a conductive material having a low work function arranged between the at least one layer of organic material and the first layer of conductive material, wherein the second layer of conductive material is substantially thinner than the first layer of conductive material, having a thickness of at most 5 nm, and consists essentially of an elemental metal having a work function of at most 3.7 eV.

9. An organic light-emitting device, comprising at least one layer of a light-emissive organic material arranged between an anode and a cathode for the device, wherein the cathode comprises a first layer of a conductive material which is an opaque metallic layer of high conductivity and a second layer of a conductive material having a low work function arranged between the at least one layer of organic material and the first layer of conductive material, wherein the second layer of conductive material is substantially thinner than the first layer of conductive material, having a thickness of at most 5 nm, and comprises an elemental metal, an alloy or an intermetallic compound having a work function of at most 3.7 eV, wherein the ratio of the thickness of the first layer to the second layer is at least 20:1.

10. An organic light-emitting device, comprising at least one layer of a light-emissive organic material arranged between an anode and a cathode for the device, wherein the cathode comprises a first layer of a conductive material which is an opaque metallic layer of high conductivity and a second layer of a conductive material having a low work function arranged between the at least one layer of organic material and the first layer of conductive material, wherein the second layer of conductive material is substantially thinner than the first layer of conductive material, and the second layer has a thickness in a range of 0.5 to 2 nm.

11. An organic light-emitting device, comprising at least one layer of a light-emissive organic material arranged between an anode and a cathode for the device, wherein the cathode comprises a first layer of a conductive material which is an opaque metallic layer of high conductivity and a second layer of a conductive material having a low work function arranged between the at least one layer of organic material and the first layer of conductive material, wherein the second layer of conductive material is substantially thinner than the first layer of conductive material, having a thickness in a range of 0.5 to 2 nm, and comprises a material having a work function of at least 3.7 eV.

* * * * *

UNITED STATES PATENT AND TRADEMARK OFFICE
CERTIFICATE OF CORRECTION

PATENT NO. : 6,255,774 B1
DATED : July 3, 2001
INVENTOR(S) : Karl Pichler

It is certified that error appears in the above-identified patent and that said Letters Patent is hereby corrected as shown below:

<u>Column 5, claim 6,</u>
Line 7, delete "any of".

Signed and Sealed this

Eleventh Day of December, 2001

Attest:

NICHOLAS P. GODICI
Attesting Officer  Acting Director of the United States Patent and Trademark Office

UNITED STATES PATENT AND TRADEMARK OFFICE
CERTIFICATE OF CORRECTION

PATENT NO.     : 6,255,774 B1                                       Page 1 of 1
DATED          : July 3, 2001
INVENTOR(S)    : Karl Pichler It is certified that error appears in the above-identified patent and that said Letters Patent is hereby corrected as shown below:

Column 6,
Line 31, please delete "least" and substitute -- most --

Signed and Sealed this

Fifteenth Day of October, 2002

Attest:

Attesting Officer

JAMES E. ROGAN
*Director of the United States Patent and Trademark Office*